United States Patent [19]

Asamaki et al.

[11] Patent Number: 4,919,783
[45] Date of Patent: Apr. 24, 1990

[54] APPARATUS FOR PROCESSING AN OBJECT BY GAS PLASMA WITH A REDUCED DAMAGE

[75] Inventors: Tatsuo Asamaki; Hideo Mito; Yukito Nakagawa; Atsushi Sekiguchi, all of Tokyo, Japan

[73] Assignee: Anelva Corporation, Tokyo, Japan

[21] Appl. No.: 128,775

[22] Filed: Dec. 4, 1987

[30] Foreign Application Priority Data

Dec. 5, 1986 [JP] Japan .................. 61-289920

[51] Int. Cl.$^5$ .................. C23C 13/08; C23C 14/00
[52] U.S. Cl. .................. 204/298.16; 118/723; 118/724
[58] Field of Search .................. 204/298, 298 ME; 118/50.1, 723, 724

[56] References Cited

U.S. PATENT DOCUMENTS

| 3,869,368 | 3/1975 | Beardmore et al. | 204/192.16 |
| 4,401,054 | 8/1983 | Matsuo et al. | 118/50.1 |
| 4,426,275 | 1/1984 | Meckel et al. | 204/298 |
| 4,492,620 | 1/1985 | Matsuo et al. | 204/192.12 |
| 4,511,451 | 4/1985 | Sella et al. | 204/298 |
| 4,610,770 | 9/1986 | Saito et al. | 204/192.1 |
| 4,664,747 | 5/1987 | Sekiguchi et al. | 204/192.32 |
| 4,705,595 | 11/1987 | Okudaira et al. | 204/192.34 |

FOREIGN PATENT DOCUMENTS 55-141729 11/1980 Japan .
57-177975 11/1982 Japan .
62-227089 10/1987 Japan .

OTHER PUBLICATIONS

Itoo et al, "Semiconductor World", Jan. 1985, pp. 73–74 and pp. 103–106.

Primary Examiner—John F. Niebling
Assistant Examiner—Steven P. Marquis
Attorney, Agent, or Firm—Foley & Lardner, Schwartz, Jeffery, Schwaab, Mack, Blumenthal & Evans

[57] ABSTRACT

For processing an object by the use of gas plasma generated in a predetermined gas, such as nitrogen, in cooperation of an electromagnetic wave with a static, an alternating, and a rotating magnetic field, an apparatus comprises a magnet around a first part of a reaction vessel to produce the magnetic field substantially parallel to an interface at which the first part is contiguous with a second part of the reaction vessel so as to confine the gas plasma within the first part. The interface may be open ultraviolet rays and charged or neutral particles produced by the gas plasma. Alternatively, an optical window may be disposed at the interface to use only the ultraviolet rays with the object held within the second part.

17 Claims, 5 Drawing Sheets

APPARATUS FOR PROCESSING AN OBJECT BY GAS PLASMA WITH A REDUCED DAMAGE

BACKGROUND OF THE INVENTION

This invention relates to an apparatus for processing an object in response to or by the use of gas plasma. More particularly, this invention relates to an apparatus which is of the type described and operable in an electron cyclotron resonance (ECR) mode.

An apparatus of the type described, will be referred to herein as a gas plasma processing device When operable in the ECR mode, the gas plasma processing device will be called an ECR device.

Various ECR devices are already known. For example, a few ECR devices are described in the Japanese language in an article contributed by ITOO Yooichi et al of the present assignee to a Japanese technical periodical named "Semiconductor World," 1985 January issue, pages 73, 74, and 103 to 106. In the Itoo et al article, citation is made as regards ECR devices of the types disclosed in Japanese Patent Prepublications (Kookai) Nos. 141,729 of 1980 and 177,975 of 1982. An ECR device is revealed in U.S. Patent Application Ser. No. 845,718 filed Mar. 28, 1986, (now U.S. Pat. No. 4,664,749, issued May 12, 1987) by Atushi Sekiguchi and Hideo Mito, two of the present applicants. Another ECR device is disclosed in Japanese Patent Application No. 69,646 of 1986, filed by the instant assignee for a surface processing method and apparatus therefor invented by the above named Atushi Sekiguchi and Hideo Mito.

In the manner which will later be described in connection with this invention, such a gas plasma processing apparatus comprises a reaction vessel which defines a hollow space. The reaction vessel comprises, in turn, first and second parts defining first and second spaces which are contiguous to the hollow space at an interface. A predetermined gas is introduced at least into the first space. The predetermined gas is, for example, nitrogen. When used, nitrogen may fill both the first and the second spaces. Alternatively, nitrogen may be caused to flow mainly through the first space alone. In this event, silane (monosilane) and/or disilane may be caused to flow through the second space.

A permanent magnet or an electromagnet is disposed around the first part in generating a magnetic field transversely of the interface. A magnetron is used in sending an electromagnetic wave into the hollow space. By cooperation of the electromagnetic wave with the magnetic field, gas plasma is produced in the predetermined gas. The second space is for an object which should be processed in response to the gas plasma.

When nitrogen is used in the first space with silane used in the second space, the gas plasma products are electrons, nitrogen ions, and nitrogen activated species including free radicals and excited species. In response to such plasma products, silicon nitride is produced in the second space.

The ECR device is useful in processing an object having a low capability of withstanding a high temperature. In the ECR device, the first space is used as a cavity resonator for the electromagnetic wave. With this, an electron cyclotron resonance (ECR) condition is achieved in the first space.

Even with the ECR device, the object is bombarded by charged particles, such as electrons and ions. This causes damages to the object. In order to reduce the damages, it has been known to situate a mesh electrode at the interface. The mesh electrode is used to prevent the charged particles from bombarding the object. It is, however, unavoidable that the charged particles bombard the mesh electrode to cause damages to the mesh electrode.

SUMMARY OF THE INVENTION

It is therefore an object of the present invention to provide an apparatus for processing an object in response to gas plasma with a reduced damage to the object.

It is another object of this invention to provide an apparatus of the type described, in which the object is little bombarded by charged particles produced in the gas plasma.

It is still another object of this invention to Provide an apparatus of the type described, which can selectively utilize gas plasma products of a plurality of kinds.

Other objects of this invention will become clear as the description proceeds.

In accordance with this invention, there is provided an apparatus which is for processing an object in response to gas plasma and comprises a reaction vessel comprising a first and a second part defining a first and a second space, respectively, the first and second spaces being contiguous at an interface to form a hollow space in the reaction vessel, and which further comprises means for introducing a predetermined gas at least into the first space, means for holding the object in the second space, magnetic field generating means for generating a magnetic field at least in the first space, and means for supplying an electromagnetic wave into the first space to produce the gas plasma in the predetermined gas, wherein the magnetic field generating means is for generating the magnetic field substantially only in the first space parallel to the interface.

DESCRIPTION OF THE PREFERRED EMBODIMENTS

Figure 1:
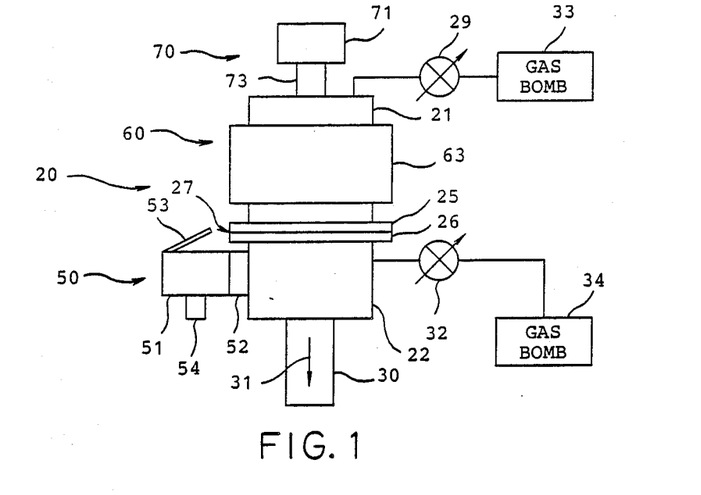
FIG. 1 is a schematic side view of an apparatus according to a first embodiment of the instant invention.
Figure 2:
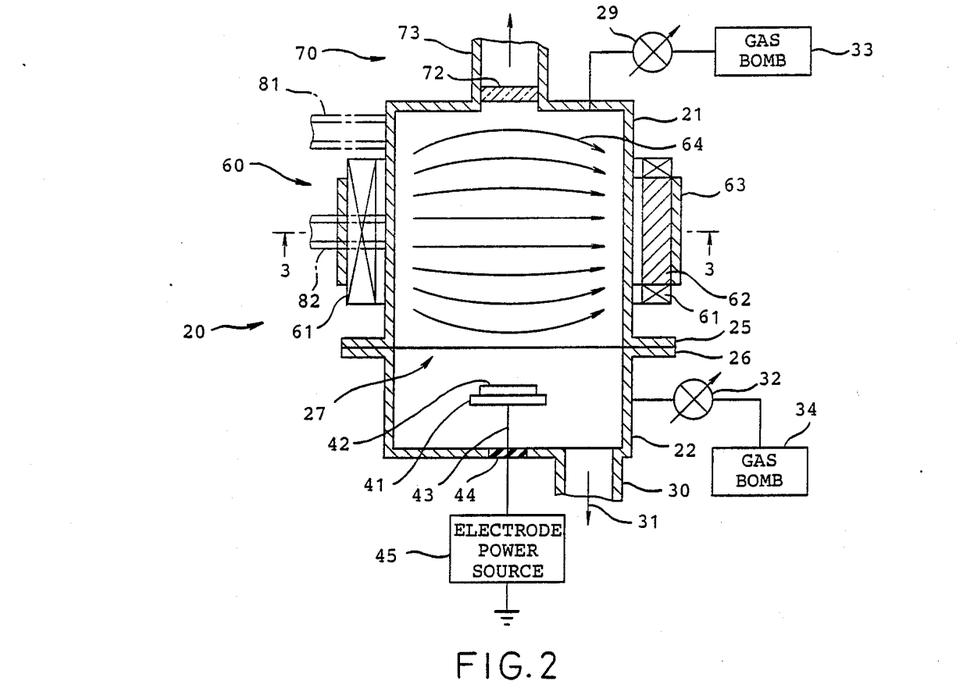
FIG. 2 is a schematic vertical sectional view of the apparatus depicted in FIG. 1.

Referring to FIGS. 1 and 2, an apparatus according to a first embodiment of this invention is for processing an object in response to or by the use of gas plasma. The apparatus includes a reaction vessel 20 of a cylindrical shape which preferably has a circular cross section. The reaction vessel 20 has a cylinder axis as a vessel axis and comprises, in turn, first and second parts 21 and 22 which define a first and a second space, respectively. Substantially orthogonal to the cylinder axis, the first part 21 has a top end and a bottom end. Similarly, the second part 22 has a top and a bottom end. The first part 21 has a first flange 25 at the bottom end and has an open part at the top end thereof. The second part 22 has a second flange 26 at the top end thereof. The flanges 25 and 26 are used to connect the first and second parts 21 and 22 together. With this, the first and the second spaces are contiguous at an interface 27 in a hollow space defined by the reaction vessel 20. It should be noted that the interface 27 need not be coplanar with a plane interposed between the flanges 25 and 26.

The first part 21 is accompanied by a first inlet pipe having an interposed variable leak valve 29 for introducing a first predetermined gas into the first space. The second part 22 is accompanied by a main exhaust pipe 30 at the bottom end thereof for evacuating the hollow space as shown by an arrow 31 and a second inlet pipe having another interposed variable leak valve 32 for introducing a second predetermined gas into the second space. The first and the second predetermined gases may be either a single gas or different gases. Numerals 33 and 34 designate gas bombs or cylinders for the first and the second gases. When single gas is used in the first and the second spaces, the gas bomb 33 alone is sufficient.

As shown in FIG. 2, the apparatus further includes a holder 41 for holding the object in the second space with the object held substantially parallel to the interface 27. The object is depicted at 42. A plurality of objects may be held on the holder 41. The holder 41 has an electrode stay 43 and an insulating spacer 44 interposed between the electrode stay 43 and the bottom end of the second part 22. With this, the holder 41 is operable as an electrode to be supplied with a d.c. electric voltage or an r.f. electric voltage by an electrode power source 45 interposed between the electrode stay 43 and ground.

The apparatus further includes an object transferring member 50 comprising an air-tight vessel 51 connected to the second space 24 through a valve 52. A lid 53 is provided on the air tight vessel 51. When the valve 52 is closed with the lid 53 also closed, the air-tight vessel 52 defines an object transferring space. An additional exhaust pipe 54 is attached to the air-tight vessel 51 in communication with the object transferring space. With the lid 51 put in an opened position depicted in FIG. 1 and with the valve 52 closed, the object 42 is at first put into the air-tight vessel 51. It may be mentioned here that the second space is kept at a pressure between $10^{-3}$ and $10^{-2}$ Torr either with the second predetermined gas or with the first predetermined gas common to the first space. The object transferring space is evacuated by the additional exhaust pipe 54 to the pressure between $10^{-3}$ and $10^{-2}$ Torr. Thereafter, the object 42 is transferred into the second space 24 through the valve 52.

A magnetic field generating member 60 comprises magnetic coils 61 disposed beside the first part 21. The coils 61 are wound nearly parallel to the cylinder axis. The coils 61 collectively serve as an electromagnet for generating a magnetic field substantially only in the first space 23. The electromagnet has pole pieces 62 and a yoke 63 for producing lines of magnetic force 64 parallel to the interface 27.

Figure 3:
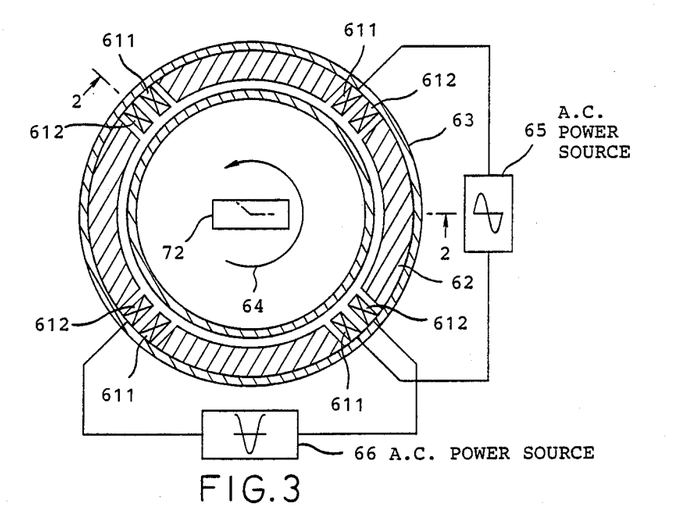
FIG. 3 is a schematic horizontal sectional view of the apparatus taken on lines 3—3 of FIG. 2.

Turning to FIG. 3 for a short while, the magnetic coils 61 comprise first and second coils 6 and 612 orthogonal to each other. The coils 611 and 612 are supplied with alternating currents with a phase shift of 90 degrees by a.c. power sources 65 and 66. With this, magnetic lines of force 64 rotate as a rotating magnetic field 64 (same reference numeral being used) rotating around the vessel axis.

Turning back to FIGS. 1 and 2, an electromagnetic wave supplying member 70 comprises a magnetron 71, a silica glass member 72 extended at the open part of the first part 21 to enclose the first space in cooperation with the first part 21. A ceramics member may be used instead of the silica glass member 72. A waveguide 73 is disposed between the magnetron 71 and the silica glass member 72. In an excitation mode, the magnetron 71 generates an electromagnetic wave which has an electric field component transversely of the magnetic field. Gas plasma is produced in the first predetermined gas.

The apparatus operates like a conventional apparatus for processing the object 42 by the gas plasma and ia operable in an electron cyclotron resonance (ECR) mode to serve as an etching apparatus, sputtering apparatus, CVD (chemical vapor deposition) apparatus, photo CVD apparatus, and the like.

It will be assumed that the CVD apparatus is for depositing a silicon nitride film on the object 42 in response to the gas plasma. The object 42 is placed on the holder 41. Thereafter, the hollow space is evacuated through the main exhaust pipe 30 to a predetermined pressure, for example, between $10^{-8}$ and $10^{-5}$ Torr. Nitrogen and silane (monosilane are used as the first and the second gases, each at the pressure between $10^{-4}$ and $10^{-2}$ Torr. The rotating magnetic field 64 is produced in the first space by energizing the a.c. power sources 65 and 66. Similarly, the electric field is supplied by energizing the magnetron 71. It is to be noted that the rotating magnetic field 64 has a flux density variable with a predetermined period when measured at a certain straight line which is perpendicular to the vessel axis. In order to achieve the electron cyclotron resonance (ECR), the first part 21 has a diameter of about 200 mm and a height of about 200 mm to be operable as a cavity resonator for the electromagnetic wave of the $TE_{113}$ mode of 2.45 GHz. In this event, the magnetic flux density should be about 875 Gauss at least instantaneously within each half cycle of the predetermined period.

Figure 4:
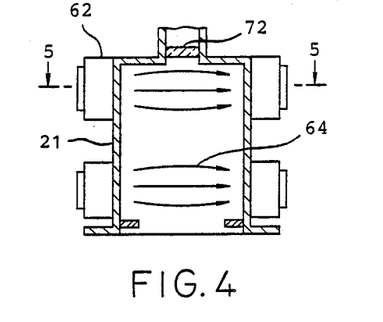
FIG. 4 is a schematic partial sectional view of a modification of the apparatus depicted in FIG. 1.
Figure 5:
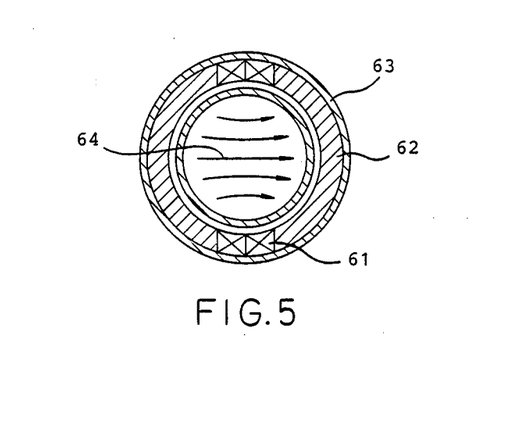
FIG. 5 is a schematic horizontal sectional view of the modification of the apparatus taken on lines 5—5 of FIG. 4.

Temporarily referring to FIGS. 4 and 5, the pole pieces 62 may be of either a permanent magnet for a static field or an electromagnet for an alternating magnetic field. It will be seen that such pole pieces 62 are disposed upwardly and downwardly around the first part 21. The static magnetic field should have a magnetic flux density which is about 875 Gauss. The alternating magnetic field is variable with a predetermined period and should have a magnetic flux density of 875 Gauss or more at least instantaneously within each half cycle of the predetermined period.

In such an apparatus, the gas nitrogen plasma takes place efficiently in the first predetermined gas and brings about electrons, nitrogen ions, nitrogen activated species, and ultraviolet rays as the plasma products. The electrons and the ions are charged particles. Although the nitrogen activated species and the ultraviolet rays can reach the object 42, the charged particles are confined in the first space by the magnetic field 64 which is parallel to the interface 27. Therefore, it is possible to process the object 42 in response to only the activated species and the rays with a reduced damage thereto.

Figure 12:
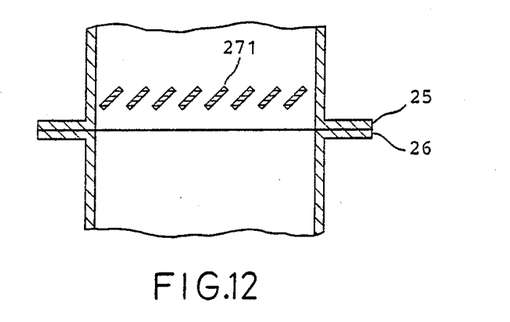
FIG. 12 is a schematic partial sectional view of a further modification of the apparatus depicted in FIG. 1.
Figure 13:
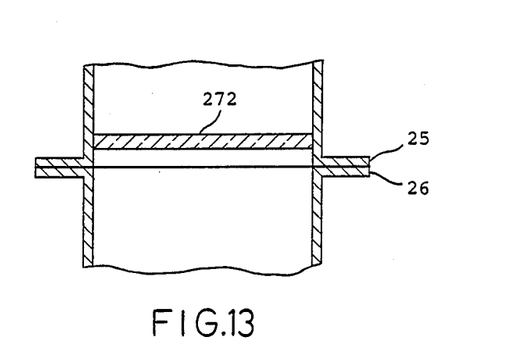
FIG. 13 is a schematic partial sectional view of a still further modification of the apparatus depicted in FIG. 1.

Description will now be made as regards a case of selectively utilizing either the activated species or the ultraviolet rays. On utilizing only the activated species, a plurality of opaque members 271 (FIG. 12) are disposed at the interface 27. When only the ultraviolet rays should be used, an optical glass plate 272 (FIG. 13) is placed throughout the interface 27 to separate the second space from the first space.

Figure 14:
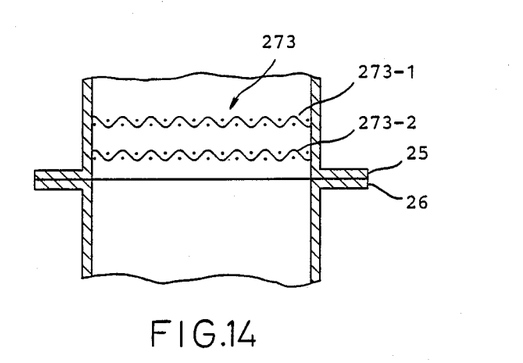
FIG. 14 is a schematic partial sectional view of a yet further modification of the apparatus depicted in FIG. 1.

On utilizing the ions, a mesh electrode 273 (FIG. 14) is disposed at the interface 27 and electrically insulated from the reaction vessel 20. The mesh electrode 273 comprises a first partial mesh electrode 273-1 and a second partial mesh electrode 273-2. The first partial mesh electrode 273-1 is given a floating potential and the second partial mesh electrode 273-2 is given a positive potential.

In this event, the holder 41 is used as the electrode by energizing the electrode power source 45. In this manner, it is possible to selectively utilize the gas plasma products of a plurality of kinds. This selection of the gas plasma products should be determined by the manner in which the object 42 is processed as shown by TABLE1 hereafter.

TABLE 1

| first gas | second gas | gas plasma product | kind of processing |
|---|---|---|---|
| $H_2$, $O_2$, $N_2$, rare gas (He, Ar, Kr, Xe, etc.) metal gas (Hg, Hg mixed with Xe or Na) | $SiH_4 + N_2$ $SiH_4$ etc. | ultraviolet rays *with separating first gas from second gas by optical glass | photo-deposition |
| $O_2$ or $N_2O$ | $SiH_4$ | activated species and ultraviolet rays | deposition ($SiO_2$) |
| $N_2$ or $NH_3$ | $SiH_4$ | | ($Si_3N_4$) |
| $H_2$ | $SiH_4$ | | ($\alpha$-Si:H) |
| $H_2$ or Ar | $CH_4$ | | (C) |
| $O_2$ | | ultraviolet | |
| $CF_4$ | — | rays and/or activated species | etching |
| $Cl_2$ | | | |

The description will now proceed to a case where the pressure of the nitrogen is increased up to $10^{-1}$ Torr or further up to 1 Torr with an enough power supplied to the magnetron 71. The gas plasma reaches an LTE (Local Thermal Equilibrium) state or a high temperature non-equilibrium state. The LTE gas plasma or high temperature non-equilibrium plasma strongly emits the ultraviolet rays in the first space. Such ultraviolet rays are called vacuum ultraviolet rays because the vacuum ultraviolet rays can not transmit through the atmosphere. The vacuum ultraviolet rays are useful in CVD processing, etching, or otherwise processing the object 42. This is because the vacuum ultraviolet rays have short wavelengths to produce high energy.

Referring back to FIG. 2, a TM mode is more preferable than the TE mode to direct an electric field perpendicular to the magnetic field. In order to conveniently produce the TM mode, a pair of additional electromagnetic wave supplying members 81 and 82 are attached to the first part 21. Only one of the additional electromagnetic wave supplying members 81 and 82 is sufficient.

Figure 6:
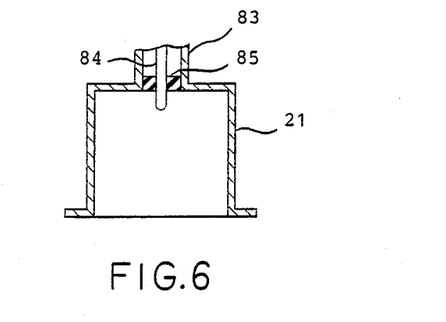
FIG. 6 is a schematic partial sectional view of another modification of the apparatus depicted in FIG. 1.

Referring to FIG. 6, a coaxial cable is used instead of the waveguide 73 (FIGS. 1 and 2). The coaxial cable comprises an external conductor 83 connected to the first part 21 and an internal conductor 84 passing into the first space through a dielectric member 85 enclosing the first space in cooperation with the first part 21.

Figure 7:
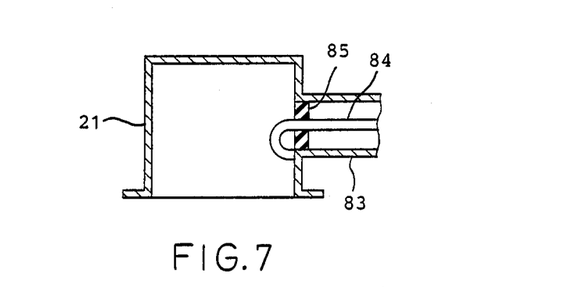
FIG. 7 is a schematic partial sectional view of still another modification of the apparatus depicted in FIG. 1.

Referring to FIG. 7, the coaxial cable comprises the external conductor 83 connected to the first part 21 and the internal conductor 84 passing through the dielectric member 85. The internal conductor 84 has a loop shape in the first space and has an end connected to an internal wall of the first part 21.

Figure 8:
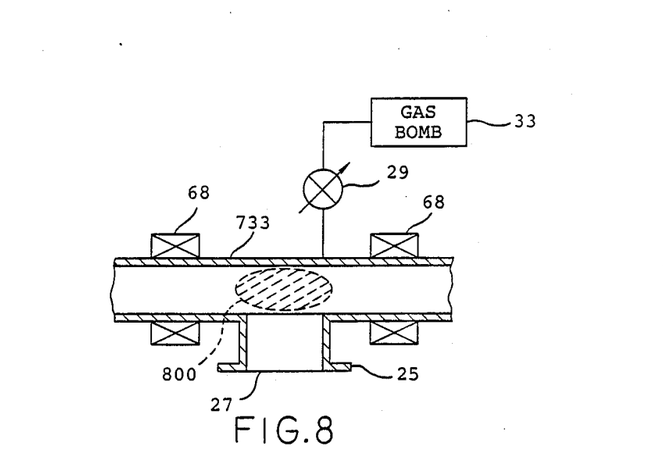
FIG. 8 is a schematic partial sectional view of an apparatus according to a second embodiment of this invention.

Referring to FIG. 8, an apparatus according to a second embodiment of this invention comprises similar parts designated by like reference numerals. The electromagnetic wave supplying member 70 includes a waveguide 733. The waveguide 733 extends parallel to the interface 27 along the top end of the first part 21. Furthermore, the magnetic field generating member 60 consists essentially of Helmholts coils 68 disposed around peripheral sides of the waveguide 733 on both sides of the first part 21. The Helmholts coils 68 generates a static magnetic field parallel to the interface 27 in the first space. With this, the gas plasma ia produced in the manner indicated at 800 in an upper part of the first space. If necessary, the object 42 may be disposed in a lower part of the first space.

Figure 9:
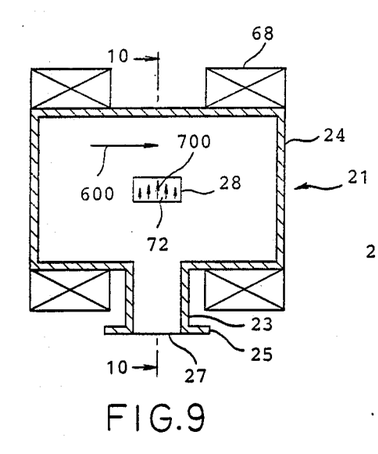
FIG. 9 is a schematic partial sectional view of an apparatus according to a third embodiment of this invention.
Figure 10:
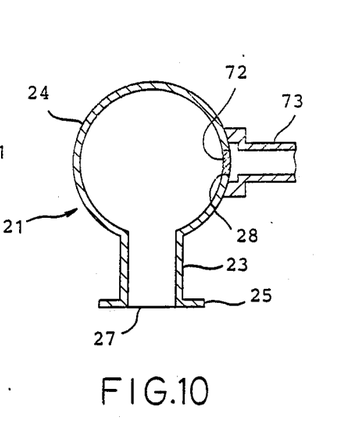
FIG. 10 is a schematic vertical sectional view of the apparatus taken on lines 10—10 of FIG. 9.

Referring to FIGS. 9 and 10, an apparatus according to a third embodiment of this invention comprises similar parts designated by like reference numerals. The first part 21 comprises a neck part 23 and a head part 24. The neck part 23 extends from the flange 26 to the head part 24. The head part 24 is shaped like a cylinder which has a cylinder axis parallel to the interface 27, namely, perpendicular to the above-mentioned vessel axis. At a side wall portion of the head part 24, an open part 28 is formed perpendicular to both the interface 27 and the cylinder axis of the head part 24. The magnetic field generating member 60 essentially consists of Helmholtz coils 68. The Helmholtz coils 68 surround peripheral parts of the head part 24 to generate the magnetic field parallel to the interface 27 in a direction indicated by an arrow 600. The silica glass member 72 encloses the first space in cooperation with the head part 24. The waveguide 73 extends parallel to the interface 27 perpendicular to the cylinder axis of the head part 24. In this event, the electromagnetic wave must be a linearly polarized wave such as of the $TE_{10}$ mode in a direction of the electric field component indicated by arrows 700 in order to be perpendicular to the magnetic field produced by the Helmholtz coils 68. It may be understood that the electromagnetic wave of the $TE_{10}$ mode is propagated into the first space in an X mode so as to efficiently heat the gas plasma. Therefore, the apparatus is well suited to selective use of the activated species and the rays rather than the charged particles.

This description will now be made as regards a case where the open part 28 is disposed at a cylinder end of the head part 24 perpendicularly of the magnetic field. It may be understood in this event that the electromagnetic wave is propagated into the first space in an O mode. In this O mode, the electromagnetic wave is propagated only when the wave has an angular frequency $\omega$ which is higher than the gas plasma angular frequency $\omega_p$. In a case of $\omega/2\pi = 2.45$ GHz, the gas plasma has a density which is not higher than about $n_e \approx 7 \times 10^{10} cm^{-3}$. Therefore, the O mode is useful in efficiently producing low density gas plasma.

Figure 11:
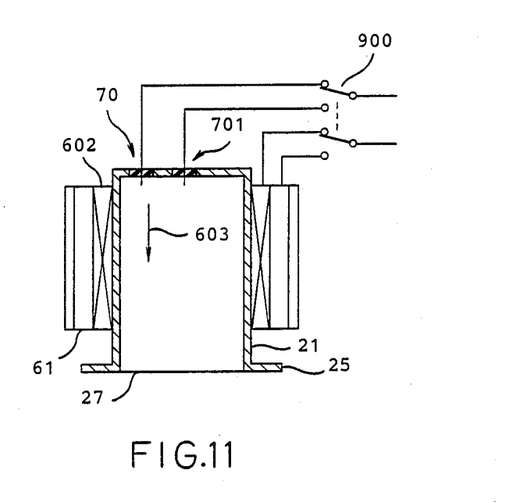
FIG. 11 is a schematic partial sectional view of an apparatus according to a fourth embodiment of this invention.

Referring to FIG. 11, an apparatus according to fourth embodiment of this invention comprises parts similar to those illustrated with reference to FIG. 2 and designated with like reference numerals. It is to be noted in FIG. 11 that the apparatus additionally comprises a mirror field coil 602, an additional electromagnetic wave supplying member 701 supplying an electromagnetic wave of the $TE_{113}$ mode, and a switching member 900. The mirror field coil 602 is disposed around the first part 21 inwardly of the magnetic coils 61 and produces a mirror field perpendicular to the interface 27 in a direction indicated by an arrow 603. When the switching member 900 is used to put the Helmholtz coil 602 and the additional electromagnetic wave supplying member 701 into operation, the apparatus is operable as the conventional ECR device.

What is claimed is:

1. An apparatus operable in an electron cyclotron resonance mode to process an object by using plasma generated by interaction of a magnetic field, an electromagnetic wave, and a predetermined gas, said apparatus comprising:

a reaction vessel defining a hollow space and having a vessel axis and first and second parts which define first and second spaces, respectively, by spatially dividing said hollow space in a direction orthogonal to said hollow space, said first and said second parts being attached to each other through an interface;

means for introducing said predetermined gas at least into said first space;

holding means for holding an object to be processed in said second space at a state transverse to said vessel axis;

magnetic field generating means adjacent to said first part for generating a magnetic field which is confined substantially within said first space and which has lines of magnetic force transverse to said vessel axis and substantially parallel to said interface to prevent charged particles from passing through said interface; and means for supplying said electromagnetic wave into said first space to produce said gas plasma by making said predetermined gas, said electromagnetic wave, and said magnetic field interact with one another.

2. An apparatus as claimed in claim 1, wherein said first space is operable as a cavity resonator for said electromagnetic wave.

3. An apparatus as claimed in claim 2, wherein said electromagnetic wave is supplied to said hollow space in an excitation mode wherein said electromagnetic wave has an electric field component transversely of said magnetic field.

4. An apparatus as claimed in claim 3, wherein said magnetic field is a static magnetic field.

5. An apparatus as claimed in claim 4, wherein said magnetic field has a magnetic flux density for exciting electron cyclotron resonance condition to produce said gas plasma.

6. An apparatus as claimed in claim 3, wherein said magnetic field is an alternating magnetic field.

7. An apparatus as claimed in claim 6, said alternating magnetic field having a magnetic flux density variable with a predetermined period, wherein said flux density is for exciting electron cyclotron resonance condition to produce said gas plasma at least instantaneously within each half cycle of said predetermined period.

8. An apparatus as claimed in claim 3, said reaction vessel having a vessel axis perpendicular to said interface, wherein said magnetic field is a rotating magnetic field rotatable around said vessel axis.

9. An apparatus as claimed in claim 8, said rotating magnetic field having a magnetic flux density variable with a predetermined period when measured at a straight line perpendicular to said reaction axis, wherein said flux density is for exciting electron cyclotron resonance condition to produce said gas plasma at least instantaneously within each half period of said predetermined period.

10. An apparatus as claimed in claim 1, wherein said interface is open for rays and activated species which are produced by said gas plasma.

11. An apparatus as claimed in claim 1, further comprising selectively passage allowing means at said interface for allowing passage of activated species produced by said gas plasma and for inhibiting passage of rays produced by said gas plasma.

12. An apparatus as claimed in claim 11, wherein said selectively passage allowing means comprises a plurality of opaque members which are disposed so as to allow passage of said activated species and to inhibit passage of said rays.

13. An apparatus as claimed in claim 1, further comprising selectively passage allowing means at said interface for allowing passage of rays produced by said gas plasma and for inhibiting passage of activated species produced by said gas plasma.

14. An apparatus as claimed in claim 13, wherein said selectively passage allowing means comprises an optical window throughout said interface.

15. An apparatus as claimed in claim 1, further comprising selectively passage allowing means at said interface for allowing passage of charged particles produced by said gas plasma.

16. An apparatus as claimed in claim 15, wherein said selectively passage allowing means comprises a mesh electrode.

17. An apparatus as claimed in claim 1, wherein said reaction vessel comprises a head portion and a neck portion having a diameter smaller than that of said head portion, said magnetic field generating means producing said magnetic field in said head portion.

* * * * *

UNITED STATES PATENT AND TRADEMARK OFFICE
CERTIFICATE OF CORRECTION

PATENT NO. : 4,919,783

DATED : April 24, 1990

INVENTOR(S) : Tatsuo ASAMAKI et al

It is certified that error appears in the above—identified patent and that said Letters Patent is hereby corrected as shown below:

Column 1, line 12, after "device" insert --.--.

Column 1, line 26, "4,664,749" should read --4,664,747--.

Column 2, line 18, "Provide" should read --provide--.

Column 3, line 17, "cross section" should read --cross-section--.

Column 4, line 19, "6" should read --611--.

Column 4, line 38, "ia" should read --is--.

Column 6, line 46, "26" should read --25--.

Column 7, line 17, before "fourth" insert --a--.

Signed and Sealed this

Thirtieth Day of June, 1992

Attest:

DOUGLAS B. COMER

*Attesting Officer*     *Acting Commissioner of Patents and Trademarks*